US012787668B2

(12) United States Patent
Gu et al.

(10) Patent No.: US 12,787,668 B2
(45) Date of Patent: Nov. 3, 2026

(54) METHOD OF GLASS DEPOSITION FOR SEMICONDUCTOR DEVICE FABRICATION

(71) Applicant: Littelfuse Semiconductor (Wuxi) Co., Ltd., Wuxi (CN)

(72) Inventors: Xingchong Gu, Wuxi (CN); Jifeng Zhou, Wuxi (CN); Lei He, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 362 days.

(21) Appl. No.: 18/426,127

(22) Filed: Jan. 29, 2024

(65) Prior Publication Data

US 2024/0258099 A1 Aug. 1, 2024

(30) Foreign Application Priority Data

Jan. 30, 2023 (CN) ........................ 202310046028.8

(51) Int. Cl.
*H01L 21/02* (2006.01)
*H10P 14/20* (2026.01)
(Continued)

(52) U.S. Cl.
CPC ...... *H10P 14/6923* (2026.01); *H10P 14/2905* (2026.01); *H10P 14/3442* (2026.01); *H10P 14/3444* (2026.01); *H10P 14/6326* (2026.01)

(58) Field of Classification Search
CPC .... H10D 84/676; H10D 84/60; H10D 84/853; H10D 84/038; H10D 18/00; H10D 18/01; H10D 18/60; H10D 62/104; H10D 62/10; H10D 62/106; H10D 62/124; H10D 62/192; H10D 62/17; H10P 14/6923; H10P 14/692; H10P 14/2905; H10P 14/20; H10P 14/3442; H10P 14/3444; H10P 14/6326;
(Continued)

(56) References Cited

U.S. PATENT DOCUMENTS 7,129,144 B2 * 10/2006 Tseng ...................... H10D 8/80
257/E29.337
2005/0245006 A1 * 11/2005 Tseng .................. H10D 62/126
257/E29.337
(Continued)

FOREIGN PATENT DOCUMENTS

EP 0579502 A2 1/1994
JP S55123174 A 9/1980
(Continued)

OTHER PUBLICATIONS

Sze, Semiconductor Devices, Chapter 13, pp. 452-466 , 1985 (Year: 1985).*

(Continued)

*Primary Examiner* — Nikolay K Yushin
(74) *Attorney, Agent, or Firm* — KDW Firm, PLLC

(57) ABSTRACT

Techniques for plating a wafer with electrical glass during fabrication of semiconductor devices in the wafer. An electrical-conductivity network is formed in the wafer by doping a surface region of an isolation structure of the wafer. The isolation structure laterally isolates the semiconductor devices from one another in the wafer. After forming the electrical-conductivity network in the wafer, a glass deposition of a respective plating is formed atop each of one or more plating regions of the wafer.

19 Claims, 3 Drawing Sheets

FIG. 4

(51) Int. Cl.
*H10P 14/60* (2026.01)
*H10P 14/692* (2026.01)

(58) Field of Classification Search
CPC ...... H10P 14/60; H10P 14/46; H10W 74/134; H10W 74/10; H10W 74/137
See application file for complete search history.

(56) References Cited

U.S. PATENT DOCUMENTS

| | | | |
|---|---|---|---|
| 2008/0112880 | A1 | 5/2008 | Kayama |
| 2011/0081752 | A1 | 4/2011 | Shimoyama |
| 2017/0221959 | A1 | 8/2017 | Udrea |
| 2019/0041346 | A1 | 2/2019 | Stacey |
| 2020/0211905 | A1 | 7/2020 | Huang |
| 2022/0174228 | A1 | 6/2022 | Carr |

FOREIGN PATENT DOCUMENTS

| | | | |
|---|---|---|---|
| JP | S5747613 | A | 3/1982 |
| JP | 2001358328 | A | 12/2001 |
| TW | 201034133 | A | 9/2010 |
| TW | 201232580 | A | 8/2012 |
| TW | 201401343 | A | 1/2014 |
| TW | 201705511 | A | 2/2017 |
| TW | 201833251 | A | 9/2018 |
| TW | 201933574 | A | 8/2019 |
| TW | 202431636 | A | 8/2024 |

OTHER PUBLICATIONS

Extended European Search Report for EP Application No. 24153524.4, dated Jul. 12, 2024, 12 pages.

* cited by examiner

METHOD OF GLASS DEPOSITION FOR SEMICONDUCTOR DEVICE FABRICATION

CROSS-REFERENCE TO CORRESPONDING APPLICATIONS

This application claims the benefit of priority to, Chinese Patent Application No. 202310046028.8, filed Jan. 30, 2023, entitled "METHOD OF GLASS DEPOSITION FOR SEMICONDUCTOR DEVICE FABRICATION," which application is incorporated herein by reference in its entirety.

BACKGROUND

Embodiments presented in this disclosure relate to the field of semiconductor devices. More specifically, embodiments disclosed herein relate to techniques for glass deposition for fabricating semiconductor devices such as power switching devices.

Semiconductor devices are widely used in control of electric power, ranging from light dimmers electric motor speed control to high-voltage direct current power transmission. For instance, thyristors are used for alternating current (AC) power control applications. Thyristors can operate as an electric power switch because the thyristors are characterized by an ability to rapidly switch from a state of non-conductivity to a state of conductivity. In operation, thyristors turn on, switching from a high-impedance state to a low-impedance state. This is done by applying a voltage between a gate and a cathode and running current from the gate to the cathode.

SUMMARY

One embodiment presented in this disclosure provides a method of plating a wafer with electrical glass during fabrication of semiconductor devices in the wafer. The method includes forming an electrical-conductivity network in the wafer by doping a surface region of an isolation structure of the wafer. The wafer includes a substrate layer, and the doping is performed with a doping agent. The isolation structure laterally isolates the semiconductor devices from one another in the wafer. The method also includes, after forming the electrical-conductivity network in the wafer, forming, for each of one or more plating regions of the wafer, a glass deposition of a respective plating atop the respective plating region. The respective plating includes electrical glass.

Another embodiment provides a wafer plated with electrical glass. The wafer includes an isolation structure that laterally isolates semiconductor devices from one another in the wafer. The wafer also includes, for each of the semiconductor devices, a lower base layer and a substrate layer disposed above the lower base layer. The wafer also includes, for each of the semiconductor devices, a upper base layer disposed above the substrate layer. The wafer also includes, for each of the semiconductor devices, a top layer disposed above the upper base layer. The wafer also includes an electrical-conductivity network formed by doping a surface region of the isolation structure with a doping agent. The wafer also includes, for each of one or more plating regions of the wafer, a plating atop the respective plating region, where the plating includes electrical glass.

Yet another embodiment provides a semiconductor device fabricated in a wafer plated with electrical glass. The semiconductor device includes a lower base layer and a substrate layer disposed above the lower base layer. The semiconductor device also includes an upper base layer disposed above the substrate layer. The semiconductor device also includes a top layer disposed above the upper base layer. The semiconductor device also includes a respective plating at each of one or more plating regions of the semiconductor device, where the respective plating includes electrical glass. The semiconductor device is of semiconductor devices fabricated from the wafer. The wafer includes an isolation structure that laterally isolates the semiconductor devices from one another in the wafer. The wafer also includes an electrical-conductivity network formed by doping a surface region of the isolation structure with a doping agent.

DETAILED DESCRIPTION

Embodiments presented in this disclosure provide techniques for glass deposition for fabricating semiconductor devices such as power switching devices. One embodiment includes forming an electrical-conductivity network in a wafer by doping a surface region of an isolation structure of the wafer. A glass deposition is then formed atop one or more plating regions of the wafer. Doing so can, at least in some cases, increase a measure of uniformity of the glass deposition across the wafer as a result of presence of the electrical-conductivity network. For instance, doing so can reduce incidence of the glass deposition being thicker at a boundary of a wafer and thinner at a center of the wafer, such as due to presence of the isolation structure causing electrical conductivity to be reduced at the center relative to the electrical conductivity at the boundary, which is connected to electrodes during the glass deposition process. Advantageously, the semiconductor devices can thereby be fabricated with greater measures of quality, consistency, and/or efficiency.

Although embodiments are described herein with reference to a particular example of a semiconductor device for sakes of illustration and explanation, such is not intended to be limiting of the scope of disclosed embodiments. The particular example constitutes a thyristor, a known device based on four different semiconductor layers arranged in electrical series and generally formed within a monocrystalline substrate such as silicon. The thyristor includes four layers of materials of alternating types of alternating polarity type, positive (P) or negative (N), where the layers are arranged between an anode and a cathode. Those skilled in the art will recognize that more generally, other types of power switching devices and semiconductor devices can be fabricated using the techniques disclosed herein.

Figure 1:
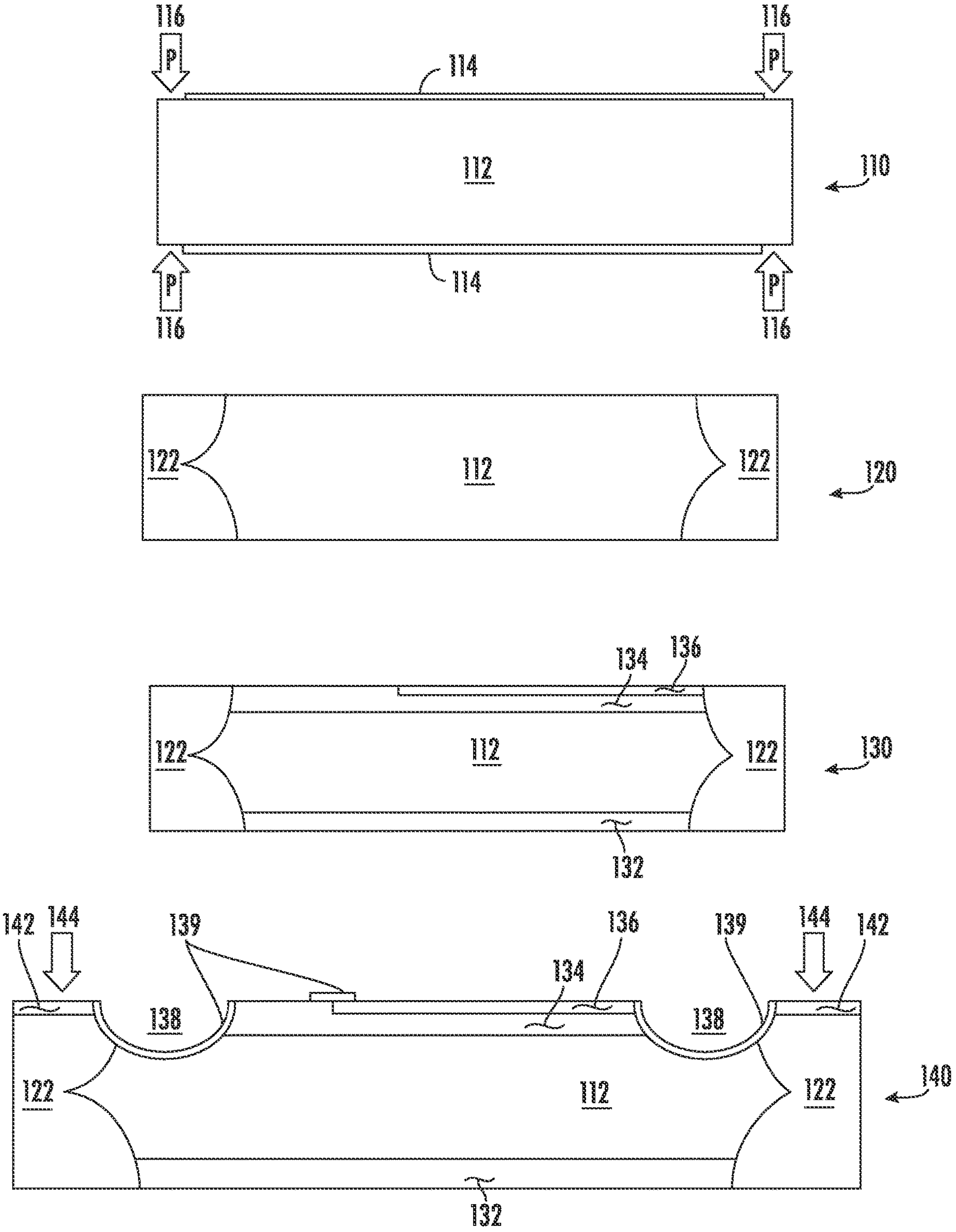
FIG. 1 depicts cross-sectional views of a portion of a wafer during different stages of a fabrication process that includes glass deposition, according to one embodiment presented in this disclosure.

FIG. 1 depicts cross-sectional views of a portion of a wafer during different stages of a fabrication process that includes glass deposition, according to one embodiment. The portion pertains to just one of multiple semiconductor devices to be fabricated in the wafer. The cross-sectional views correspond to vertical cross sections of the wafer, that is, cross sections that are perpendicular to a face of the wafer. As shown, at a first stage of the fabrication process, a wafer 110 includes a substrate layer 112, where the substrate layer 112 includes silicon. Both of the top and bottom surfaces of the substrate layer 112 are doped using a doping agent 116 and a doping mask 114. As used herein, a top surface is also referred to as an upper surface or front surface, while a bottom surface is also referred to as a lower surface or rear surface. The doping mask 114 includes oxide, according to one embodiment.

In the case of the substrate layer 112 being an $N^-$ substrate layer, the doping agent 116 used is a P doping agent. An example of a P doping agent is boron, while an example of an N doping agent is phosphorous. As used herein with reference to doping agents, signs in superscript or the lack thereof represents relative doping concentrations, where a plus sign represents a higher relative doping concentration, a minus sign represents a lower relative doping concentration, and the lack of a sign represents a medium relative doping concentration. The signs are usable herein, even when the signs are not in superscript, interchangeably with the same signs in superscript. Multiple plus signs or minus signs in a row can be used to denote successively higher or lower relative doping concentrations.

Doping the substrate layer 112 of the wafer 110 using the doping agent 116 produces a wafer 120 having an isolation structure 122 at a second stage of the fabrication process, according to one embodiment. The isolation structure 122 laterally isolates semiconductor devices from one another in the wafer. In the case of the P doping agent being used, the isolation structure is a P isolation structure. Generally, the isolation structure 122 is formed once the doping agent 116 diffused from the top surface and the bottom surface of the wafer 120 meet. Put another way, to form the isolation structure 122, each of the top and bottom surfaces of the substrate layer 112 is doped using the doping agent 116 until the diffused doping agent from the top surface meets the diffused doping agent from the bottom surface. The point at which the diffused doping agent meets can generally be proximate to a vertical center of the wafer 110 in terms of a thickness of the wafer 110.

In one embodiment, both of the top and bottom surfaces of the substrate layer 112 of the wafer 120 can be further doped using the doping agent 116 to produce a wafer 130 having a lower base layer 132 and an upper base layer 134. In the case of the P doping agent being used, the lower base layer 132 is a P lower base layer, and the upper base layer is a P upper base layer. The upper base layer 134 can then be doped using a different doping agent. Doping the upper base layer 134 produces a top layer 136. In the case of the $N^-$ substrate layer, this doping agent is an $N^+$ doping agent, and the top layer 136 is an $N^+$ top layer.

After the top layer 136 is produced, the isolation structure 122 is doped with another doping agent 144 to produce a wafer 140 having an electrical-conductivity network formed on the top surface of the isolation structure 112, according to one embodiment. More specifically, one or more regions of the upper surface of the isolation structure 122, such as the surface regions 142, are doped. In this regard, the upper surface of the isolation structure 112 can be entirely or partially doped, depending on the embodiment.

In the particular example shown, the upper surface of the isolation structure 112 is entirely doped. In this scenario, the doping agent 144 is diffused laterally across the upper surface of the isolation structure 122. Further, the isolation structure 112 is partially, but not entirely, doped in terms of thickness of the wafer 140, according to one embodiment. In this regard, the doping agent 144 is partially diffused vertically through the isolation structure 112 in terms of the thickness of the wafer 140.

On the other hand, at least in some embodiments, the bottom surface of the isolation structure 112 is not at all doped for purposes of forming any electrical-conductivity network described herein, and further, no electrical-conductivity network is formed on the bottom surface of the isolation structure 112. In the case of the $N^-$ substrate layer, the doping agent 144 used can be a $P^+$ doping agent or an $N^+$ doping agent; the same goes for the alternative case of the $P^-$ substrate layer. The electrical-conductivity network is more readily shown in the plan view of FIG. 3.

In some embodiments, after forming the electrical-conductivity network, a moat 138 is formed for each semiconductor device in the wafer 140. More specifically, the moat 138 can be characterized as being formed around the upper base layer 134 of each semiconductor device based on the plan view of the wafer. As such, the moat 138 circumscribes the upper base layer 134 based on the plan view of the wafer. The moat 138 can be formed via an etching process such as a silicon etching process.

Further, the moat 138 partially exposes each of the substrate layer 112, the upper base layer 134, the top layer 136, and the isolation structure. Moreover, the substrate layer 112 is exposed only via the moat 138. On the other hand, at least in some embodiments, the moat 138 does not expose any of the lower base layer 132. Because the moat 138 has a cylindrical shape in the wafer 140, the moat 138 has a shape of a half-circle based on the cross-sectional view of the wafer 140, according to one embodiment. The upper base layer 134, however, need not necessarily be exposed by the moat 138, depending on the type of semiconductor device to be fabricated in the wafer 140. In certain alternative embodiments, the upper base layer 134 is not at all exposed via the moat 138.

After forming the moat 138, a glass deposition, represented as glass 139, is formed atop one or more plating regions on the top surface of the wafer 140. The one or more plating regions can include a respective one or more plating regions of each semiconductor device in the wafer 140. In a particular embodiment, the respective one or more plating regions include the moat 138 itself and one or more additional regions in an area circumscribed by the moat 138 based on the plan view of the wafer. The glass deposition constitutes a respective plating atop each of the plating regions, the respective plating including electrical glass, according to one embodiment.

Advantageously, due to presence of the electrical-conductivity network in the wafer 140, the glass deposition can be formed with a greater measure of uniformity in thickness across the wafer. For instance, undesirable variances in thickness of the plating can be avoided, where the undesirable variances are characterized by an undesirably reduced thickness of the plating nearer the center of the wafer than nearer the boundary of the wafer, as a result of the isolation structure 112 being present.

As such, the electrical-conductivity network can counteract a loss of electrical conductivity in areas of the wafer that are farther away from the boundary of the wafer. More specifically, the boundary of the wafer is connected to electrodes during the glass deposition process, resulting in relatively higher electrical conductivity proximate to the boundary of the wafer. The loss is caused by presence of the isolation structure 112 resulting in relatively lower electrical conductivity proximate to the center of the water. By counteracting the loss of electrical conductivity using the techniques disclosed herein, the process for fabricating semiconductor devices is thereby improved.

Although embodiments are described herein with reference to an $N^-$ substrate layer for sakes of illustration and explanation, such is not intended to be limiting of the scope of disclosed embodiments. For instance, by inverting the respective polarity of each doping agent disclosed herein, the techniques disclosed herein are applicable to the alternative use—case of a $P^-$ substrate layer.

Further, at least in some embodiments, each type of polarity of the doping agent used to form the electrical-conductivity network is applicable to each of the $N^-$ substrate layer and the $P^-$ substrate layer. That is to say, even when inverting the respective polarity of each doping agent disclosed herein, it is optional to invert the doping agent used to form the electrical-conductivity network. Put another way, for purposes of the techniques disclosed herein, it suffices that the upper and lower base layers and the isolation structure are of a polarity type that is the inverse of a polarity type of the substrate and top layers, while any polarity type can be used for doping to form the electrical-conductivity network.

Nevertheless, it may still be preferential to select, for the electrical-conductivity network, a polarity type matching that of the top layer, because doing so allows the electrical-conductivity network and the top layer to be formed concurrently or simultaneously via doping, at least in some cases. This aspect of forming the electrical-conductivity network and the top layer concurrently or simultaneously is described further below in conjunction with the flowchart of FIG. 4.

Figure 2:
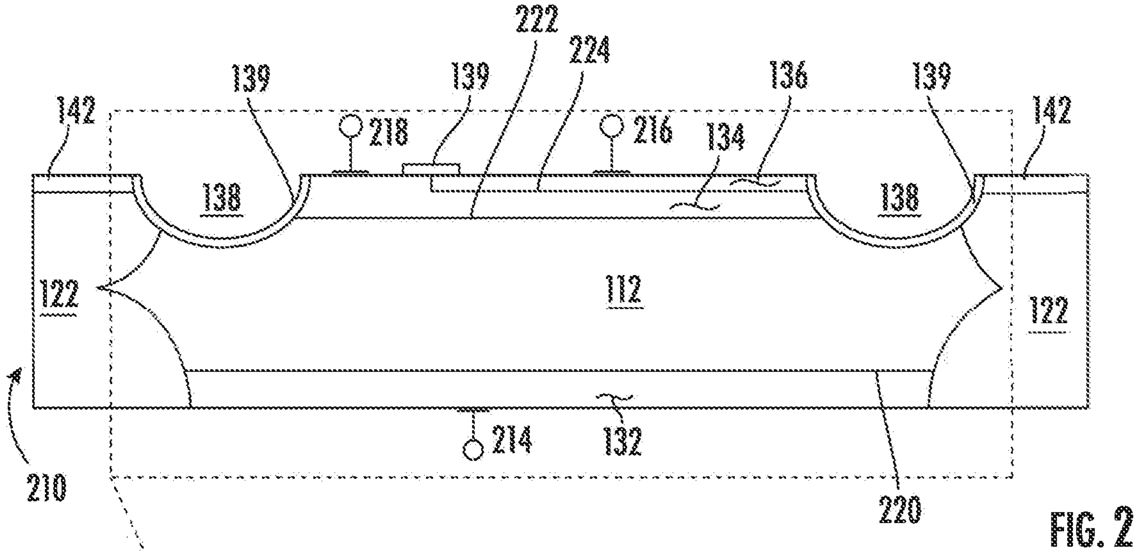
FIG. 2 depicts a cross-sectional view of the portion of the wafer during a subsequent stage of the fabrication process that includes glass deposition, according to one embodiment presented in this disclosure.

FIG. 2 depicts a cross-sectional view of the portion of the wafer during a stage of the fabrication process that includes glass deposition, where the stage is subsequent to the stages represented in FIG. 1, according to one embodiment. The cross-sectional view corresponds to a vertical cross section of the wafer, where the vertical cross section is represented by a dotted line in the plan view of FIG. 3.

As shown in FIG. 2, the semiconductor device in the wafer 210 is a thyristor 212. The thyristor has terminals including an anode 214, a cathode 216, and a gate 218. The anode 214 is formed on the lower base layer 132, the cathode 216 is formed on the top layer 136, and the gate 218 is formed on the upper base layer 134. Further, each of the lower base layer 132 and the top layer 136 constitutes a respective emitter layer of the thyristor 212. That the lower base layer 132 constitutes an emitter layer can be the case for certain types of thyristors, such as silicon controlled rectifiers (SCRs). For certain other types of thyristors, such as alternating current (TRIACs), the lower base layer does not constitute any emitter layer.

Moreover, the thyristor 212 has P-N junctions including a first junction J1 220, a second junction J2 222, and a third junction J3 224. The first junction J1 220 is disposed between the lower base layer 132 and the substrate layer 112. The second junction J2 222 is disposed between the substrate layer 112 and the upper base layer 134. The third junction J3 224 is disposed between the upper base layer 134 and the top layer 136.

Figure 3:
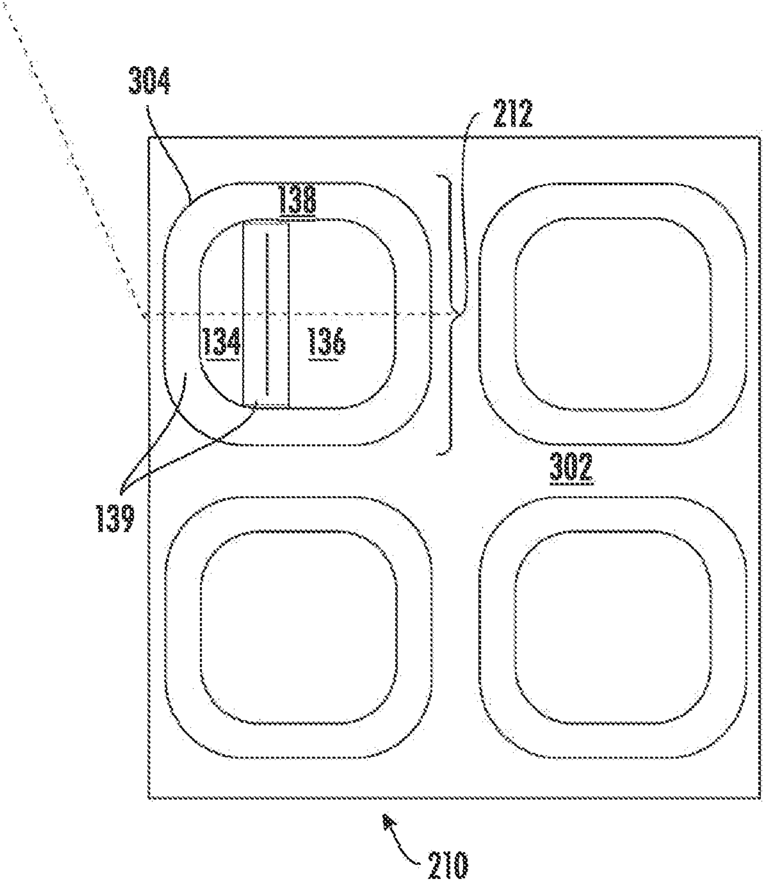
FIG. 3 depicts a plan view of the wafer during the subsequent stage of the fabrication process that includes glass deposition, according to one embodiment presented in this disclosure.

FIG. 3 depicts the plan view of the wafer 210 during the subsequent stage of the fabrication process that includes glass deposition, according to one embodiment. The plan view is from a perspective of looking downward at the top surface of the wafer 210. Further, the plan view is of a portion of the wafer 210 that is greater in size than the portion depicted in FIG. 1 or 2. In particular, the portion shown in the plan view includes four thyristors, one of which is the thyristor 212. That is, the plan view is of a portion that is approximately four times the size of the portion depicted in FIG. 1 or 2.

As shown in FIG. 3, the plan view includes the top layer 136 of the thyristor 212, the upper base layer 134 of the thyristor 212, and the moat 138 of the thyristor 212. Each of the interior and exterior shapes of the moat 138 is characterized by a shape of a square with rounded corners, according to one embodiment. The glass deposition, represented by the glass 139 of the thyristor 212, is formed both atop the moat 138 and atop a region where the upper base layer 134 meets the top layer 136 based on the plan view.

In this particular example, an entirety of the top surface of the isolation structure is doped to form an electrical-conductivity network 302. For instance, the boundaries of the electrical-conductivity network 302 can correspond to a respective boundary 304 of the isolation structure for each thyristor in the wafer 210. In such an instance, the isolation structure is occluded by the electrical-conductivity network 302 such that the isolation structure is not visible in the plan view of the wafer 210. In an alternative embodiment, the isolation structure is only partially occluded by the electrical-conductivity network 302 and remains partially visible in the plan view.

Doing so can result in the glass depositions, such as the glass 139, that are more uniform for thyristors closer to the center of the wafer 210 as compared to thyristors closer to a circumference of the wafer 210. More specifically, doing so can compensate for a reduction, in electrical conductivity, that is caused by presence of the isolation structure, in areas closer to the center of the wafer 210. As such, doing so can advantageously avoid glass depositions that are undesirably thinner proximate to the center of the wafer 210 than proximate to the circumference of the wafer 210.

Figure 4:
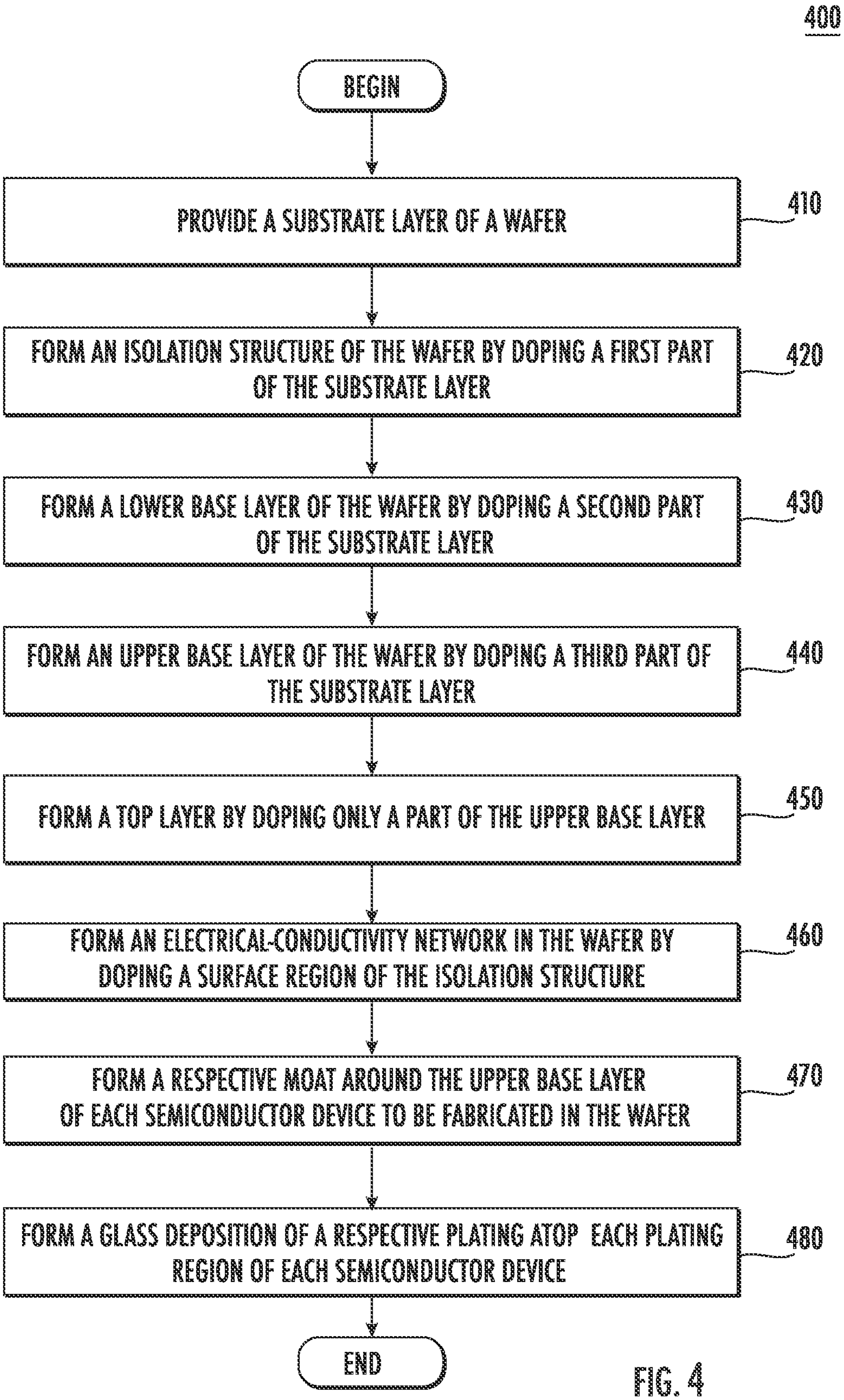
FIG. 4 is a flowchart depicting a fabrication process that includes glass deposition, according to one embodiment presented in this disclosure.

FIG. 4 is a flowchart depicting a fabrication process 400 that includes glass deposition, according to one embodiment. As shown, the fabrication process 400 begins at step 410, where a substrate layer of a wafer is provided. At step 420, an isolation structure is formed in the wafer by doping a first part of the substrate layer. At step 430, a lower base layer of the wafer is formed by doping a second part of the substrate layer. At step 440, an upper base layer is formed by doping a third part of the substrate layer 440. Depending on the embodiment, the order of the steps 430 and 440 can be reversed, or the steps 430 and 440 can be performed concurrently or simultaneously. At step 450, a top layer is formed by doping only a part of the upper base layer.

At step 460, an electrical-conductivity network is formed in the wafer by doping a surface region of the isolation structure. In cases where the same doping agent is involved, such as an $N^+$ doping agent for both steps, the steps 450 and 460 can be performed concurrently or simultaneously. In other cases where a different doping agent is involved, such as an $N^+$ doping agent for the step 450 and a $P^+$ doping agent for the step 460, the steps 450 and 460 are performed sequentially in forward or reverse order, depending on the embodiment.

At step 470, a respective moat is formed around the upper base layer of each semiconductor device to be fabricated in the wafer. At step 480, a glass deposition is formed atop each plating region of each semiconductor device in the wafer.

The glass deposition constitutes a respective plating atop each plating region, where the respective plating includes electrical glass. In some embodiments, the wafer can be further processed, including forming the terminals including the cathode, anode, and gate, and dicing the wafer to separate the semiconductor devices from the wafer, and so on. After the step 480, the fabrication process 400 terminates.

Further embodiments are described as follows. One embodiment in particular provides a method of plating a wafer with electrical glass during fabrication of semiconductor devices in the wafer. The method includes forming an electrical-conductivity network in the wafer by doping a surface region of an isolation structure of the wafer. The wafer includes a substrate layer, and the doping is performed with a doping agent. The isolation structure laterally isolates the semiconductor devices from one another in the wafer. The method also includes, after forming the electrical-conductivity network in the wafer, forming, for each of one or more plating regions of the wafer, a glass deposition of a respective plating atop the respective plating region. The respective plating includes electrical glass.

Another embodiment in particular provides a wafer plated with electrical glass. The wafer includes an isolation structure that laterally isolates semiconductor devices from one another in the wafer. The wafer also includes, for each of the semiconductor devices, a lower base layer and a substrate layer disposed above the lower base layer. The wafer also includes, for each of the semiconductor devices, a upper base layer disposed above the substrate layer. The wafer also includes, for each of the semiconductor devices, a top layer disposed above the upper base layer. The wafer also includes an electrical-conductivity network formed by doping a surface region of the isolation structure with a doping agent. The wafer also includes, for each of one or more plating regions of the wafer, a plating atop the respective plating region, where the plating includes electrical glass.

Still another embodiment in particular provides a semiconductor device fabricated in a wafer plated with electrical glass. The semiconductor device includes a lower base layer and a substrate layer disposed above the lower base layer. The semiconductor device also includes an upper base layer disposed above the substrate layer. The semiconductor device also includes a top layer disposed above the upper base layer. The semiconductor device also includes a respective plating at each of one or more plating regions of the semiconductor device, where the respective plating includes electrical glass. The semiconductor device is of semiconductor devices fabricated from the wafer. The wafer includes an isolation structure that laterally isolates the semiconductor devices from one another in the wafer. The wafer also includes an electrical-conductivity network formed by doping a surface region of the isolation structure with a doping agent.

While the present embodiments have been disclosed with reference to certain embodiments, numerous modifications, alterations and changes to the described embodiments are possible without departing from the sphere and scope of the present disclosure, as defined in the appended claims. Accordingly, it is intended that the present embodiments not be limited to the described embodiments, and that it has the full scope defined by the language of the following claims, and equivalents thereof.

What is claimed is:

1. A method of plating a wafer with electrical glass during fabrication of semiconductor devices in the wafer, the method comprising:

forming an electrical-conductivity network in the wafer by doping, with a doping agent, a surface region of an isolation structure of the wafer, wherein the isolation structure laterally isolates the semiconductor devices from one another in the wafer, the wafer comprising a substrate layer; and after forming the electrical-conductivity network in the wafer, forming, for each of one or more plating regions of the wafer, a glass deposition of a respective plating atop the respective plating region, the respective plating comprising electrical glass, wherein a measure of uniformity, in thickness, of the plating across the wafer is increased based on the electrical-conductivity network being present.

2. The method of claim 1, wherein the doping agent is diffused laterally across the surface region, wherein the doping agent is diffused partially and vertically through the isolation structure in terms of a thickness of the wafer, wherein the surface region constitutes an entire surface of the isolation structure, and wherein the electrical-conductivity network includes the surface region.

3. The method of claim 1, wherein at least one of the semiconductor devices comprises a thyristor, and wherein the substrate layer comprises silicon.

4. The method of claim 1, wherein the surface region is heavily doped with the doping agent.

5. The method of claim 1, wherein a measure of electrical conductivity of the plating across the wafer is increased based on the electrical-conductivity network being present.

6. The method of claim 1, wherein the doping agent is of a positive type (P type) or of a negative type (N type) in terms of polarity.

7. The method of claim 6, wherein:

the doping agent is of the P type and comprises boron; or the doping agent is of the N type and comprises phosphorous.

8. The method of claim 1, wherein the measure of uniformity is increased as a result of:

an increase in a measure of electrical conductivity of the plating across the wafer as a result of the electrical-conductivity network being present.

9. The method of claim 8, wherein the measure of uniformity is increased by reducing incidence of the plating:

varying in thickness as characterized by relatively greater thickness at a boundary of the wafer and relatively lesser thickness at a center of the semiconductor wafer, as measured relative to each other.

10. The method of claim 9, wherein the varying in thickness is due to the wafer:

varying in electrical conductivity as characterized by (i) relatively greater electrical conductivity at a boundary of the wafer due to the boundary being connected with one or more electrodes and (ii) relatively lesser electrical conductivity at a center of the wafer due to the isolation structure causing the electrical conductivity to be reduced at the center relative to the electrical conductivity at the boundary.

11. The method of claim 1, the wafer further comprising:

(i) a lower base layer disposed below the substrate layer;

(ii) an upper base layer disposed above the substrate layer; and (iii) a top layer disposed above the upper base layer, wherein the top layer is smaller in area than the upper base layer, thereby resulting in at least part of the upper base layer being exposed, wherein the substrate layer is greater in thickness than each of the lower base layer, the upper base layer, and the top layer, and wherein prior to the plating with electrical glass, (i) each of the substrate layer, the upper base layer, and the isolation structure is partially exposed via a respective moat around the upper base layer of each of the semiconductor devices to be fabricated, and (ii) the substrate layer is only exposed via the respective moat.

12. The method of claim 11, wherein:

the lower base layer, the isolation structure, and the upper base layer are each of a positive type (P type), while the substrate layer and the top layer are each of a negative type (N type); or the lower base layer, the isolation structure, and the upper base layer are each of the N type, while the substrate layer and the top layer are each of the P type.

13. The method of claim 11, wherein in forming the electrical-conductivity network, each of the lower base layer, the substrate layer, the upper base layer, the top layer, and a vertical remainder of the isolation structure in terms of the thickness of the wafer is not doped with the doping agent.

14. The method of claim 11, wherein the top layer includes a cathode, wherein the lower base layer includes an anode, and wherein the upper base layer includes a gate.

15. The method of claim 11, wherein the one or more plating regions comprise, for each of the semiconductor devices:

a respective moat around the upper base layer of the respective semiconductor device; and a respective one or more surface regions of the upper base layer of the respective semiconductor device;

wherein the glass deposition is not formed above the electrical-conductivity network but wherein at least part of the glass deposition is formed substantially adjacent to the electrical-conductivity network.

16. The method of claim 11, further comprising, prior to forming the electrical-conductivity network:

providing the substrate layer of the wafer;

forming the isolation structure by doping a first part of the substrate layer;

forming the lower base layer of the wafer by doping a second part of the substrate layer;

forming the upper base layer by doping a third part of the substrate layer, wherein the third part comprises, for each moat, an island region defined by the respective moat; and forming the top layer by doping only a part of the upper base layer;

wherein the method further comprises, subsequent to forming the electrical-conductivity network:

forming the respective moat around the upper base layer of each of the semiconductor devices to be fabricated; and dicing the wafer to separate the semiconductor devices from the wafer;

wherein the lower base layer, the isolation structure, and the upper base layer are of a first polarity type, and wherein the substrate layer and the top layer are of a second polarity type.

17. The method of claim 16, wherein:

the lower base layer comprises a P lower base layer, the isolation structure comprises a P isolation structure, the substrate layer comprises an N− substrate layer, the upper base layer comprises a P upper base layer, and the top layer comprises an N+ top layer; or the lower base layer comprises an N lower base layer, the isolation structure comprises an N isolation structure, the substrate layer comprises a P− substrate layer, the upper base layer comprises a P upper base layer, and the top layer comprises a P+ top layer.

18. A wafer plated with electrical glass, the wafer comprising:

an isolation structure that laterally isolates semiconductor devices from one another in the wafer;

for each of the semiconductor devices:

a lower base layer;

a substrate layer disposed above the lower base layer;

a upper base layer disposed above the substrate layer; and a top layer disposed above the upper base layer;

an electrical-conductivity network formed by doping a surface region of the isolation structure with a doping agent; and for each of one or more plating regions of the wafer, a plating is formed atop the respective plating region, the plating comprising electrical glass, wherein a measure of uniformity, in thickness, of the plating across the wafer is increased based on the electrical-conductivity network being present.

19. A semiconductor device fabricated in a wafer plated with electrical glass, the semiconductor device comprising:

a lower base layer;

a substrate layer disposed above the lower base layer;

an upper base layer disposed above the substrate layer;

a top layer disposed above the upper base layer; and a respective plating at each of one or more plating regions of the semiconductor device, the respective plating comprising electrical glass, wherein the semiconductor device is of a plurality of semiconductor devices fabricated from the wafer, the wafer including (i) an isolation structure that laterally isolates the semiconductor devices from one another in the wafer and (ii) an electrical-conductivity network formed by doping a surface region of the isolation structure with a doping agent, wherein a measure of uniformity, in thickness, of the plating across the wafer is increased based on the electrical-conductivity network being present.

* * * * *